United States Patent
Wang

(10) Patent No.: US 6,809,398 B2
(45) Date of Patent: Oct. 26, 2004

(54) METAL-TO-METAL ANTIFUSE STRUCTURE AND FABRICATION METHOD

(75) Inventor: Daniel Wang, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 09/737,642

(22) Filed: Dec. 14, 2000

(65) Prior Publication Data

US 2002/0100907 A1 Aug. 1, 2002

(51) Int. Cl.[7] .............................................. H01L 29/00
(52) U.S. Cl. .................... 257/530; 257/50; 257/529; 438/131; 438/467; 438/600; 438/957
(58) Field of Search ................. 438/131, 600, 438/467, 957; 257/50, 530, 529

(56) References Cited

U.S. PATENT DOCUMENTS

| | | | |
|---|---|---|---|
| 4,748,490 A | 5/1988 | Hollingsworth | 257/530 |
| 5,010,039 A | 4/1991 | Ku et al. | 438/702 |
| 5,021,849 A | 6/1991 | Pfiester et al. | 257/365 |
| 5,059,555 A | 10/1991 | Iranmanesh et al. | 438/328 |
| 5,070,384 A | 12/1991 | McCollum et al. | 257/530 |
| 5,272,101 A | 12/1993 | Forouhi et al. | 438/600 |
| 5,705,849 A | 1/1998 | Zheng et al. | 257/530 |
| 5,866,938 A * | 2/1999 | Takagi et al. | 257/530 |
| 6,001,693 A * | 12/1999 | Yeouchung et al. | 438/281 |
| 6,124,193 A * | 9/2000 | Hawley et al. | 438/600 |
| 6,124,194 A * | 9/2000 | Shao et al. | 438/600 |
| 6,509,209 B1 * | 1/2003 | Shroff et al. | 438/131 |
| 6,515,343 B1 * | 2/2003 | Shroff et al. | 257/530 |

* cited by examiner

Primary Examiner—Tom Thomas
Assistant Examiner—José R. Diaz
(74) Attorney, Agent, or Firm—Sierra Patent Group, Ltd.

(57) ABSTRACT

A metal-to-metal antifuse according to the present invention is compatible with a Cu dual damascene process and is formed over a lower Cu metal layer planarized with the top surface of a lower insulating layer. A lower barrier layer is disposed over the lower Cu metal layer. An antifuse material layer is disposed over the lower barrier layer. An upper barrier layer is disposed over the antifuse material layer. An upper insulating layer is disposed over the upper barrier layer. An upper Cu metal layer is planarized with the top surface of the upper insulating layer and extends therethrough to make electrical contact with the upper barrier layer.

16 Claims, 3 Drawing Sheets

US 6,809,398 B2

METAL-TO-METAL ANTIFUSE STRUCTURE AND FABRICATION METHOD

BACKGROUND OF THE INVENTION

1. Field of the Invention

The present invention relates to antifuse technology. More specifically, the present invention relates to metal-to-metal antifuse structures and fabrication methods.

2. The Prior Art

Antifuse devices are known in the art. Antifuse devices comprise a pair of conductive electrodes separated by at least one layer of antifuse material and may include one or more diffusion barrier layers. Prior to programming, antifuses exhibit very high resistance between the two electrodes and may be considered to be open circuits. A programming process disrupts the antifuse material and creates a low-impedance connection between the two conductive electrodes.

Antifuses are generally classifiable in two categories. A first type of antifuse has a doped region in a semiconductor substrate as its lower electrode and a layer of metal or doped polysilicon as its upper electrode. The antifuse material typically comprises one or more layers of silicon nitride or silicon dioxide. This type of antifuse is referred to as a substrate antifuse.

A second type of antifuse has a first metal layer disposed above and insulated from a semiconductor substrate as its lower electrode and a second metal layer as its upper electrode. The antifuse material typically comprises a layer of a material such as amorphous silicon and may be accompanied by one or more barrier metal layers separating it from lower and upper metal interconnect layers. This type of antifuse is referred to as a metal-to-metal antifuse.

Numerous structures for metal-to-metal antifuses have been proposed for and are known in the art. Illustrative and non-exhaustive examples of metal-to-metal antifuses are shown in U.S. Pat. No. 5,272,101 to Forouhi et al.

BRIEF DESCRIPTION OF THE INVENTION

A metal-to-metal antifuse according to the present invention is compatible with a Cu dual damascene process and is formed over a first Cu metal layer planarized with the top surface of a lower insulating layer. A lower barrier layer is disposed over the Cu metal layer. An antifuse material layer is disposed over the lower barrier layer. An upper barrier layer is disposed over the antifuse material layer. An upper insulating layer is disposed over the upper barrier layer. A second Cu metal layer is planarized with the top surface of the upper insulating layer and extends therethrough to make electrical contact with the upper barrier layer.

A method for fabricating a metal-to-metal antifuse according to the present invention comprises forming a lower barrier layer over a lower Cu metal layer planarized with the top surface of a lower insulating layer. An antifuse material layer is then formed over the lower barrier layer. An upper barrier layer is formed over the antifuse material layer and the upper barrier layer and antifuse layer are defined. An upper insulating layer is formed over the upper barrier layer and antifuse layer and a via is formed to expose the top surface of the upper barrier layer. A second Cu metal layer is formed and planarized with the top surface of the upper insulating layer and extends therethrough in the via to make electrical contact with the upper barrier layer.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
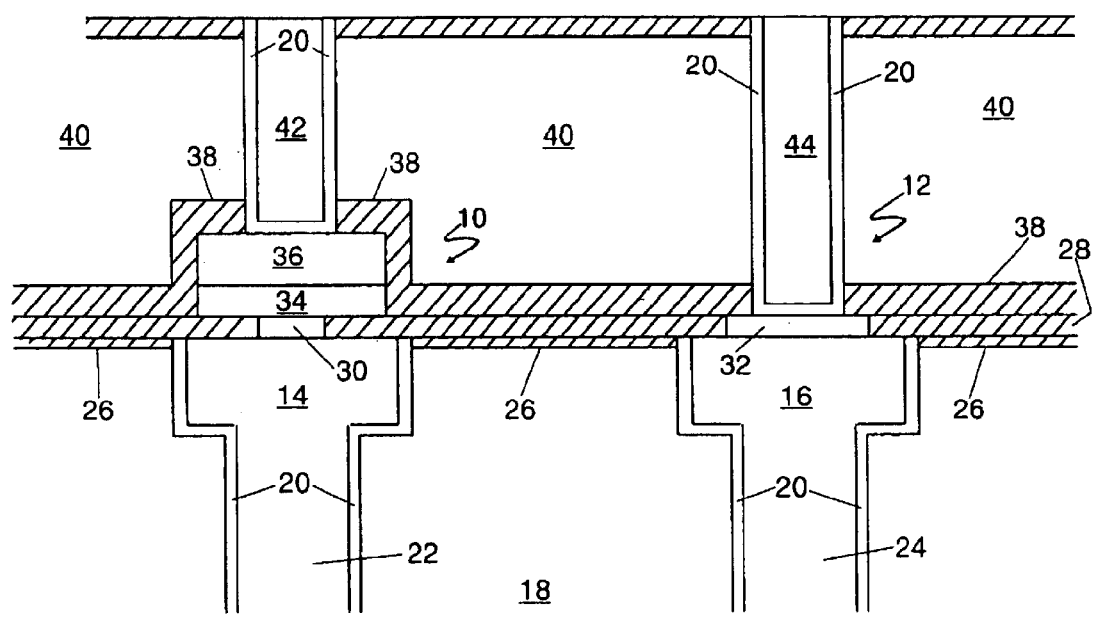
FIG. 1 is a cross-sectional view of a metal-to-metal antifuse according to the present invention.

Referring first to FIG. 1, a cross-sectional view shows a metal-to-metal antifuse according to the present invention. The metal-to-metal antifuse according to the present invention is compatible with a Cu dual damascene process and will be disclosed herein in the environment of an integrated circuit employing such a process for metalization. To illustrate how the antifuse of the present invention fits in an integrated circuit process employing a Cu dual damascene metalization process, metal-to-metal antifuse 10 is shown disposed next to a contact structure 12 disposed between two Cu metal layers in the integrated circuit.

Two different portions 14 and 16 of the lower Cu metal layer are shown disposed in lower insulating layer 18. Portion 14 of the lower Cu metal layer is associated with antifuse 10 and portion 16 of the lower Cu metal layer is interconnect metal. The vias containing portions 14 and 16 of the lower Cu metal layer are shown including lining layers 20 as is known in the Cu metalization art. In addition, both portions 14 and 16 of the lower Cu metal layer are shown including contacts (reference numerals 22 and 24, respectively) for making electrical connections to circuit elements or metal layers (not shown) disposed beneath lower insulating layer 18. The thin SiN layer 26 shown surrounding portions 14 and 16 of the lower Cu metal layer is an artifact of the damascene process as is known in the art.

A cap layer 28, which may comprise SiN or a similar capping material, is disposed over the portions 14 and 16 of the lower Cu metal layer and the thin SiN layer 26. Regions 30 and 32 comprising a layer of TaN are disposed in vias in the cap layer 28. Region 30 is a lower barrier metal layer for antifuse 10. A layer of antifuse material 34, which may comprise, for example, a layer of amorphous silicon, is disposed over the lower barrier metal layer 30 and an upper barrier metal layer. An upper barrier metal layer 36 is disposed over the layer of antifuse material 34. A cap layer 38 is disposed over the upper barrier metal layer.

An upper insulating layer 40 is disposed over the cap layer 38. As presently preferred, insulating layer 40 may comprise a lower portion formed from fluorosilicate glass (FSG) and an upper portion formed from TEOS. Two different contact portions 42 and 44 of an upper Cu metal layer are shown disposed in upper insulating layer 40. Contact 42 of the lower Cu metal layer is associated with antifuse 10 and contact 44 of the lower Cu metal layer is associated with interconnect metal. The vias containing contact portions 42 and 44 of the upper Cu metal layer are shown including lining layers 20 as is known in the Cu metalization art.

Referring now to FIGS. 2A through 2D, a method is illustrated for fabricating a metal-to-metal antifuse according to the present invention. Because the elements illustrated in FIGS. 2A through 2D in many instances correspond to elements depicted in FIG. 1, elements in FIGS. 2A through 2D corresponding to elements in FIG. 1 will be designated using the same reference numerals as used in FIG. 1.

Figure 2A:
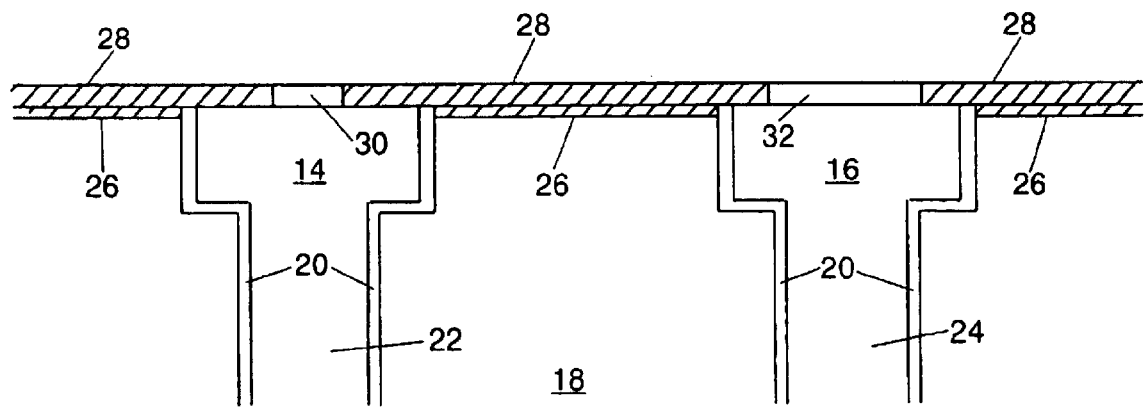
FIGS. 2A through 2D are cross-sectional views of the metal-to-metal antifuse of FIG. 1 taken after completion of selected steps in the fabrication process in order to illustrate the method of the present invention.

Referring first to FIG. 2A, a portion of the metal interconnect structure of the integrated circuit is shown after processing has progressed to the point where a lower insulating layer 18 has been deposited using conventional semiconductor processing techniques and lower Cu metal interconnect layer including portions 14 and 16 has been formed therein along with contacts 22 and 24 for making electrical connections to circuit elements or metal layers (not shown) disposed beneath lower insulating layer 18. The vias containing portions 14 and 16 of the lower Cu metal layer are shown including lining layers 20 as is known in the Cu metalization art. The top surfaces of the lower Cu metal interconnect layer and the lower insulating layer 18 have been planarized as is known in the Cu damascene metalization art. A thin SiN layer 26 surrounds portions 14 and 16 of the lower Cu metal layer and is an artifact of the damascene process as is known to persons of ordinary skill in the art.

As shown in FIG. 1, a first cap layer 28 formed from a material such as SiN, SiC, or another etch-stop layer with a low dielectric constant, having a thickness in the range of from about 10 nm to about 200 nm has been deposited over the portions 14 and 16 of the lower Cu metal interconnect, layer and the lower insulating layer 18 using conventional deposition techniques. Conventional masking and etching steps (not shown) are used to form vias in the first cap layer 28 to expose the top surfaces of portions 14 and 16 of the lower Cu metal interconnect layer, after which the masking layer is removed using conventional mask-stripping steps.

A lower barrier metal layer, comprising for example, a layer of TaN or TiN, having a thickness in the range of from about 10 nm to about 200 nm has been blanket deposited over the existing surface. Known CMP techniques are then used to remove the lower barrier metal in regions other than in the vias in the first cap layer. FIG. 2A shows the structure existing after performance of the lower barrier metal CMP step.

Figure 2B:
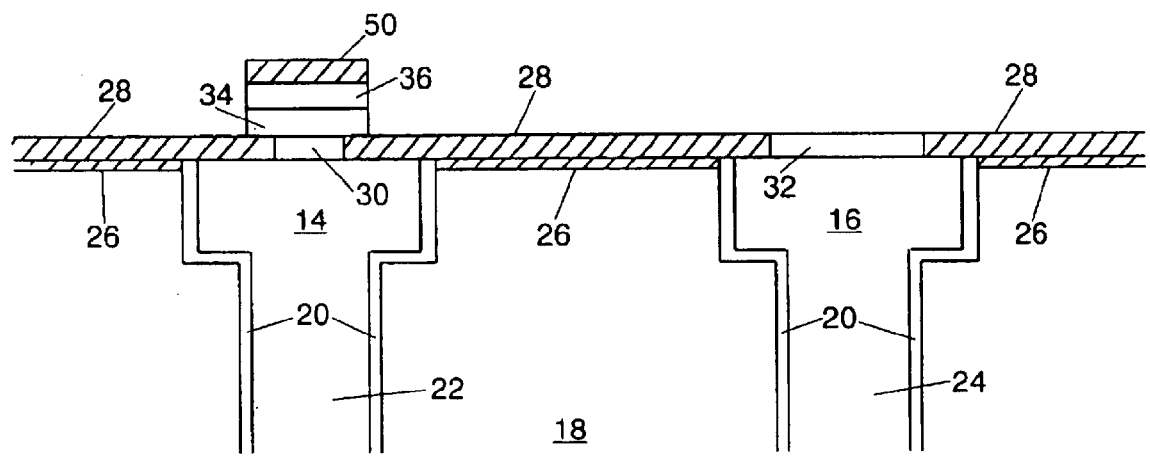

Referring now to FIG. 2B, a layer of antifuse material 34, which may comprise, for example, a layer of amorphous silicon having a thickness in the range of from about 10 nm to about 70 nm, is blanket deposited over the lower barrier metal layer 30. A non-exhaustive list of other antifuse materials suitable for use in the present invention includes SiN/α-Si, SiN/α-Si, SiN/α-Si/oxide, SiC, and α-C. Persons of ordinary skill in the art will understand that the antifuse programming voltage (VBG) exhibited for antifuses fabricated according to the present invention will depend on the composition and density of the antifuse material used as well as its thickness.

An upper barrier metal layer 36 comprising for example, a layer of TiN or TaN, having a thickness in the range of from about 10 nm to about 200 nm has been blanket deposited over the layer of antifuse material 34 using conventional go deposition techniques. Next a masking layer 50 is applied and the stack including the antifuse material layer 34 and the upper barrier layer 36 is defined using conventional etching technology. FIG. 2B shows the structure remaining after the defining etch step but prior to removal of masking layer 50.

Figure 2C:
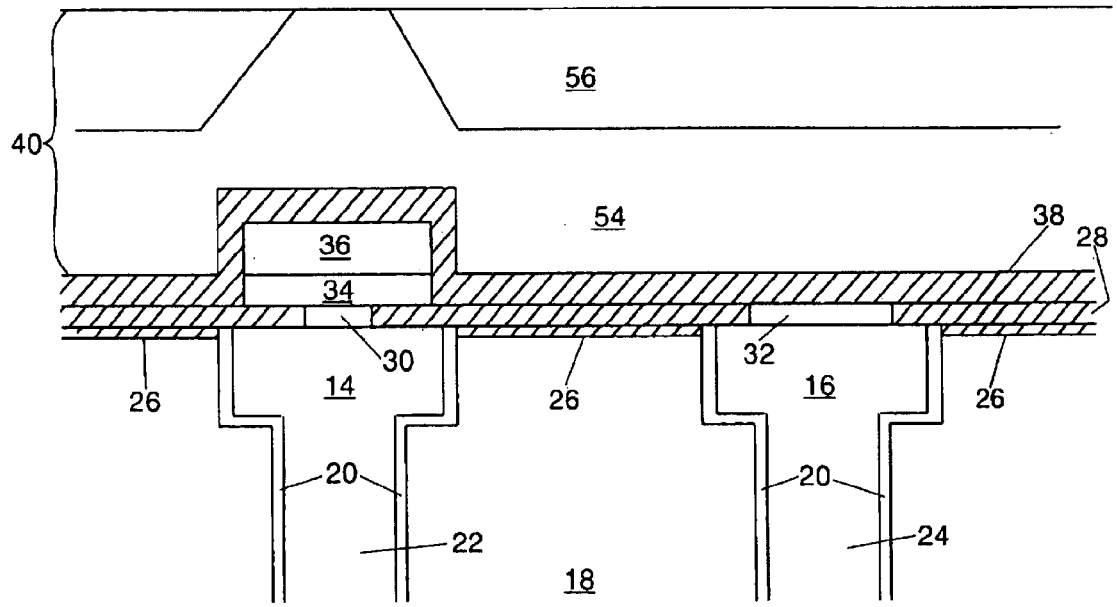

Referring now to FIG. 2C, after definition of the antifuse material layer 34 and the upper barrier layer 36, a second cap layer 38, formed from a material such as SiN, SiC, or other etch-stop layer having a low dielectric constant, having a thickness in the range of from about 10 nm to about 200 nm is blanket deposited over the exposed surface using conventional deposition techniques.

Next, an upper insulating layer 40 is deposited over the second cap layer 38. As presently preferred, insulating layer 40 may comprise a lower layer 54 formed from HDP fluorosilicate glass (FSG) and an upper layer 56 formed from TEOS. First, the FSG layer is formed to a thickness of between about 300 nm and about 400 nm using conventional high-density plasma techniques. Next, the TEOS layer is formed using conventional TEOS deposition techniques. The TEOS layer 56 is then planarized using CMP techniques. FIG. 2C shows the structure remaining after the CMP planarization process step.

Figure 2D:
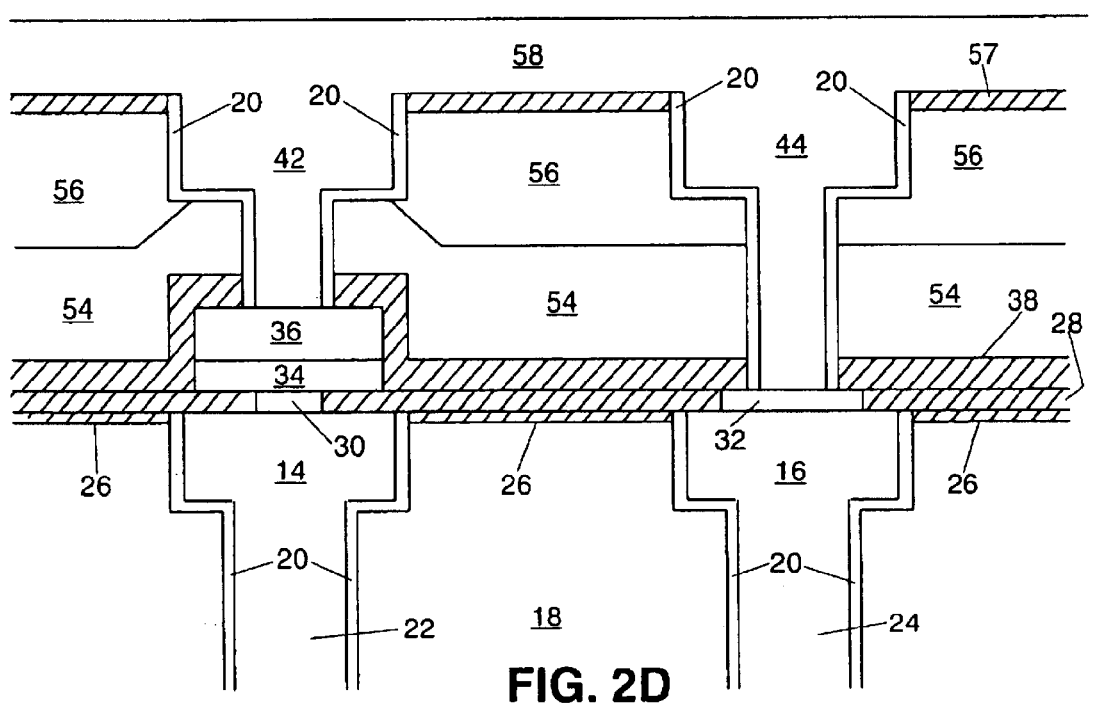

Referring now to FIG. 2D, a masking layer 57 is applied over the top of TEOS layer 56 and vias are formed in the second cap layer 38 in preparation for depositing the upper Cu metal layer 58 including contact regions 42 and 44 and to expose the top surfaces of the upper barrier metal layer 36 and the TaN region 32 over region 16 of the lower Cu metal layer. FIG. 2D shows the structure remaining after the formation of the upper Cu metal layer (including liners 20) but prior to the defination of contact regions 42 and 44 therein as a part of the damascene process.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A metal-to-metal antifuse formed over a planarized surface formed from a metal layer and the top surface of a lower insulating layer, comprising:
   a first cap layer covering the planarized surface;
   a first barrier metal layer forming an antifuse electrode disposed in a via in said cap layer over and in electrical contact with said metal layer, said via being narrower than said metal layer, said first barrier metal layer having an upper surface planarized with an upper surface of said cap layer;
   a layer of antifuse material disposed over said first barrier metal layer and having edges extending over said cap layer;
   a second barrier metal layer disposed over said antifuse material layer and having edges aligned with said edges of said antifuse material layer;
   a second cap layer disposed over said first cap layer and surrounding said antifuse material and said second barrier metal layer;
   an intermetal dielectric layer formed over said second cap layer; and
   a metal contact formed in a via in said intermetal dielectric layer and said second cap layer, said metal contact in electrical contact with said second barrier layer.

2. The metal-to-metal antifuse of claim 1, wherein said antifuse material layer comprises a layer of amorphous silicon.

3. The metal-to-metal antifuse of claim 1, wherein said first barrier layer comprises a layer of TaN.

4. The metal-to-metal antifuse of claim 1, wherein said second barrier layer comprises a layer of TiN.

5. The metal-to-metal antifuse of claim 1, wherein said first cap layer and said second cap layer are formed from SiN.

6. The metal-to-metal antifuse of claim 1, wherein said antifuse material layer comprises a layer of amorphous silicon.

7. The metal-to-metal antifuse of claim 1, wherein said first barrier layer comprises a layer of TaN.

8. The metal-to-metal antifuse of claim 1, wherein said second barrier layer comprises a layer of TiN.

9. A method of forming a metal-to-metal antifuse over a planarized surface formed from a metal layer and the top surface of a lower insulating layer, comprising:

forming a first cap layer covering the planarized surface;

forming a via in said first cap layer over said metal layer;

forming a first barrier metal layer to form an antifuse electrode in said via, said via being narrower than said metal layer, said first barrier metal layer in electrical contact with said metal layer;

planarizing said first barrier metal layer to have an upper surface planarized with an upper surface of said cap layer;

forming a layer of antifuse material over said first barrier metal layer and having edges extending over said cap layer;

forming a second barrier metal layer over said antifuse material layer and having edges aligned with said edges of said antifuse material layer;

forming a second cap layer over said first cap layer and surrounding said antifuse material and said second barrier metal layer;

forming an inter-metal dielectric layer over said second cap layer; and forming a metal contact in a via in said inter-metal dielectric layer and said second cap layer, said metal contact in electrical contact with said second barrier layer.

10. The method of claim 9, wherein said antifuse material layer comprises a layer of amorphous silicon.

11. The method of claim 9, wherein said first barrier layer comprises a layer of TaN.

12. The method of claim 9, wherein said second barrier layer comprises a layer of TiN.

13. The method of claim 9, wherein said first cap layer and said second cap layer are formed from SiN.

14. The method of claim 9, wherein said antifuse material layer comprises a layer of amorphous silicon.

15. The method of claim 9, wherein said first barrier layer comprises a layer of TaN.

16. The method of claim 9, wherein said second barrier layer comprises a layer of TiN.

* * * * *